United States Patent [19]

Hanamura

[11] 4,338,180
[45] Jul. 6, 1982

[54] PHOTOELECTRODES FOR PHOTOELECTROCHEMICAL CELLS

[75] Inventor: Michihiro Nakamura, Kurashiki, Japan

[73] Assignee: Kuraray Co., Ltd., Kurashiki, Japan

[21] Appl. No.: 210,161

[22] Filed: Nov. 25, 1980

[30] Foreign Application Priority Data

Nov. 28, 1979 [JP] Japan ................. 54/154709
Jan. 24, 1980 [JP] Japan ................. 55/7552
Feb. 19, 1980 [JP] Japan ................. 55/19907
Jun. 16, 1980 [JP] Japan ................. 55/81794
Jul. 2, 1980 [JP] Japan ................. 55/90923

[51] Int. Cl.³ .................. C25B 11/04; H01M 6/36
[52] U.S. Cl. .................. 204/290 R; 429/111
[58] Field of Search .......... 204/290 R, 290 F, 192 C; 429/111; 148/6.24

[56] References Cited

U.S. PATENT DOCUMENTS 2,591,777  4/1952  Bowen .................. 148/6.24
4,127,449 11/1978  Heller et al. .......... 204/2.1

FOREIGN PATENT DOCUMENTS 24170   2/1981  European Pat. Off. ......... 429/111
317837 11/1930  United Kingdom ............. 429/111
380168  9/1932  United Kingdom ............. 429/111

OTHER PUBLICATIONS

G. Djemal et al., "Photoelectrochemical Cells Using Polycrystalline and Thin Film MOS$_2$ Electrodes", *Solar Energy Material*, vol. 5, pp. 403–416 (1981).
G. Razzini et al., "Electrochemical Solar Cells With Layer-Type Semiconductor Anodes; Chemical Treatments of the Crystal Surface", *J. Electrochem. Soc.*, vol. 128, pp. 2134–2137 (1981).
K. A. B. Andersson et al., "Morphologies of RF Sputter-Deposited Solid Lubricants", *Vacuum*, vol. 24, pp. 379–382 (1977).
H. Tribatsch, "Electrochemical Solar Cells Based on Layer-Type Transition Metal Compounds: Performance of Electrode Material", *Solar Energy Mat'ls*, vol. 1, pp. 257–269 (1979).

*Primary Examiner*—Aaron Weisstuch
*Attorney, Agent, or Firm*—Barry Kramer

[57] ABSTRACT

The present invention provides photoelectrodes for photoelectrochemical cells, which photoelectrodes are essentially composed of a surface-chalcogenated molybdenum or tungsten metal. These photoelectrodes have long life, are highly efficient in energy conversion, and are inexpensive.

3 Claims, 2 Drawing Figures

PHOTOELECTRODES FOR PHOTOELECTROCHEMICAL CELLS

BACKGROUND OF THE INVENTION

1. Field of the Invention

The present invention relates to photoelectrodes for photoelectrochemical cells. More particularly, this invention relates to photoelectrodes composed of a surface-chalcogenated molybdenum or tungsten metal.

2. Description of the Prior Art

Recently, considerable interest has been aroused in solar energy as well as in coal and nuclear energy as substitutive energy sources for petroleum. One can cite electric power generation by solar cells as one of the methods of utilizing solar energy. However, solar cells are so expensive that their use has been quite limited. Drastic cost reduction is one of the essential conditions for solar cells to be widely used as an economical means of solar energy utilization.

In recent years, considerable research efforts have been focused on the photoelectrochemical cells (PEC), because they can be regarded as one of the candidates for economical solar cells. In the PEC, a junction between the electrolyte solution and a semiconductor photoelectrode is used as the origin of photovoltage. This liquid-semiconductor junction can be formed by inserting the semiconductor electrode in an electrolyte solution. Therefore, the junction formation is very easy in the PEC as compared with a solid state p-n junction which can be formed only by using complicated technology such as thermal diffusion, ion implantation, or co-evaporation of dopant atoms. In addition, polycrystalline semi-conductors are as effective as, or in some cases more effective than, expensive single crystal semiconductors in PEC's. These factors have led to the expectation that the PEC would be more economical than dry-type solar cells.

The most important device in the PEC is the photoelectrode which has the ability of converting photons to electricity. In order to prepare practical PEC's, the photoelectrode must be (1) highly efficient in solar energy conversion, (2) long-lived, and (3) inexpensive and easy to produce.

One of the major problems with the semiconducting materials heretofore employed in the PEC (GaP, GaAs, CdS, CdSe, CdTe) is the gradual photocorrosion which causes a rapid drop in energy conversion efficiency. Recently, it was reported that electrolytes containing polychalcogenides such as polysulfides, polyselenides and polytellurides have some stabilizing effect [A. Ellis, S. Kaiser, J. Bolts and M. Wrighton, Journal of the American Chemical Society 99, 2839, (1977)]. However, the electrolyte solutions also present problems because they are strongly alkaline and corrosive to cell wall materials, requiring the use of expensive corrosion resistant materials. There are also environmental problems since the solutions are highly toxic.

On the other hand, single crystals of chalcogenides of molybdenum or tungsten such as $MoS_2$, $MoSe_2$ and $WSe_2$ have been reported to be effective as photoelectrodes for PEC's and to be free of photocorrosion [H. Tributsch, Berichte der Bunsen-Gesellschaft für physikalische Chemie 81, 361 (1977); ibid., 82, 169, 1331 (1978)]. However, these single crystals are not adequate as practical photoelectrodes for PEC's because of difficulties and high cost of preparing them.

SUMMARY OF THE INVENTION

In accordance with the present invention, it has now been found that surface-chalcogenated molybdenum or tungsten metals act as very effective and stable photoelectrodes for PEC's, and that these photoelectrodes can easily and economically be prepared by heating metallic molybdenum or tungsten in a gaseous phase containing a chalcogen. Furthermore, according to the present invention, the energy conversion efficiency of the photoelectrodes thus obtained can be remarkably increased by the following treatments:

(A) By doping the chalcogenated layer of molybdenum or tungsten with at least one element selected from Groups IIIa, IIIb, IVa, IVb and Va of the Periodic Table. The term "doping" is intended to mean adding a small amount of said element to the crystal lattice;

(B) by causing at least one complex selected from the group consisting of molybdenum complexes, tungsten complexes and ruthenium complexes to be adsorbed on the surface of the photoelectrode;

(C) by causing at least one of the compounds represented by the general formula (I) or (II) to be adsorbed on the surface of the photoelectrode:

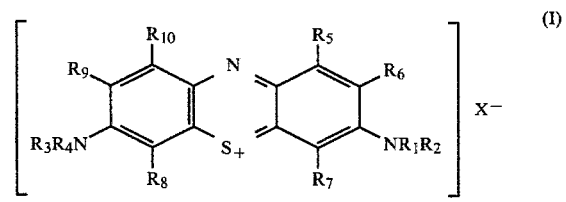

In formula (I), $R_1$, $R_2$, $R_3$ and $R_4$ each represent a hydrogen atom or an alkyl group containing 1–10 carbon atoms; $R_5$, $R_6$, $R_7$, $R_8$, $R_9$ and $R_{10}$ each represent a hydrogen atom, an alkyl group containing 1–10 carbon atoms or an alkoxy group containing 1–10 carbon atoms and $X^-$ represents an anion.

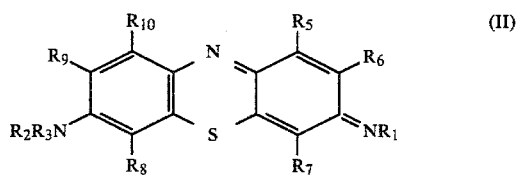

In formula (II), $R_1$, $R_2$, $R_3$, $R_5$, $R_6$, $R_7$, $R_8$, $R_9$ and $R_{10}$ are as defined above for formula (I).

DETAILED DESCRIPTION OF THE INVENTION

In this specification, sulfur, selenium and tellurium are generically referred to as "chalcogens." Additionally, the references to the Periodic Table in this specification are based on the Periodic Table shown on page 249 of the book entitled "Documenta Geigy-Scientific Tables," 6th Edition, 1962, J. R. Geigy, S. A., Basel, Switzerland. In the practice of the present invention, metallic molybdenum or tungsten is used in the form of a plate or thin film. Usually, molybdenum is preferred to tungsten because the former gives higher energy conversion efficiency than the latter. The surfaces of these metals can be chalcogenated by heating them in a gaseous phase containing an elemental chalcogen or a compound of sulfur, selenium or tellurium. As the compounds of sulfur, selenium or tellurium, there can be used hydrides, alkylates and halides of these elements. These elements or compounds can be used in the presence or absence of a gaseous diluent such as nitrogen, argon, helium or hydrogen. An optimum thickness of the chalcogenide layer on the surface of molybdenum or tungsten metal is 0.01 to 100 microns. Chalcogenide layers thinner than 0.01 micron can absorb light incompletely, resulting in a low energy conversion efficiency. Layers thicker than 100 microns also cause a decrease in efficiency because of high electric resistance. The surface chalcogenation of molybdenum or tungsten is accomplished at a temperature of 400° to 1500° C. in about 1 minute to 3 hours.

Figure 1:
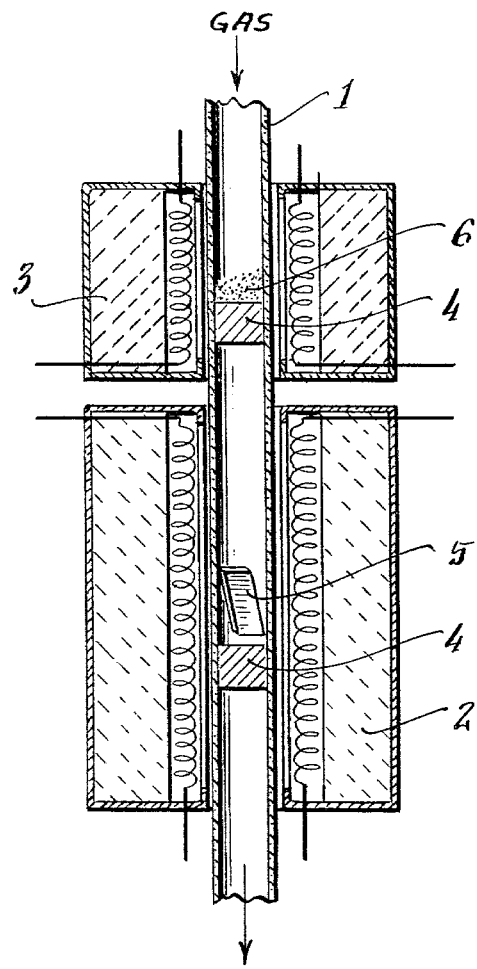
FIG. 1 illustrates an apparatus used for simultaneous chalcogenation and doping of metallic molybdenum or tungsten plates.

The doping of the chalcogenated layer on the surface of molybdenum or tungsten metal with an element belonging to Group IIIa, IIIb, IVa, IVb or Va of the Periodic Table can be performed by usual ion implantation or thermal diffusion techniques. However, and more preferably, the doping and surface chalcogenation can be performed simultaneously by carrying out chalcogenation in a gaseous phase containing a small amount of a dopant element or compound. An example of the apparatus usable for such purpose is shown in FIG. 1. In FIG. 1, a quartz reaction tube 1 is surrounded by a first electric furnace 2 and a second electric furnace 3. The metallic molybdenum or tungsten plate 5 is held in place by quartz wool 4. The dopant compound 6 is placed as shown within the reaction tube 1. The dopant compound, heated in the second furnace, reacts with the chalcogen to form the chalcogenide of the dopant, a part of which chalcogenide evaporates gradually. The chalcogen-containing gas which also contains a small amount of the chalcogenide of the dopant flows into the first furnace, where it reacts with the metal plate to form a doped molybdenum or tungsten chalcogenide layer on the plate surface. The atomic ratio of the dopant to molybdenum or tungsten in the chalcogenide layer is preferably $1.0 \times 10^{-8}$ to $2.0 \times 10^{-2}$.

According to the present invention, the adsorption of at least one complex selected from the group consisting of molybdenum complexes, tungsten complexes and ruthenium complexes on the photoelectrode surface can be achieved by immersing the photoelectrode in a solution containing at least one of these activator complexes. As the molybdenum complexes suited for this purpose, there can be used molybdic acid and salts thereof as well as halides, oxyhalides and coordination complexes of molybdenum. As the tungsten complexes, there can be used tungstic acid and salts thereof as well as halides, oxyhalides, and coordination complexes of tungsten. As the ruthenium complexes, there can be used halides, amine complexes and nitro complexes of ruthenium. Among these complexes, ammonium molybdate, sodium tungstate and ruthenium trichloride are most conveniently used since they are readily available. Furthermore, the complexes of molybdenum and tungsten are more preferable than those of ruthenium because of their stronger activating effect. The surface concentration of the complexes of molybdenum, tungsten or ruthenium adsorbed on the photoelectrode is preferably $10^{-8}$ to $10^{-3}$ mole/BET $m^2$, and more preferably $10^{-6}$ to $10^{-4}$ mole/BET $m^2$, where "BET $m^2$" denotes the surface area in $m^2$ of the photoelectrode as measured by the BET method. As the solvents for the activator complexes mentioned above, water, methanol, dimethylformamide, dimethyl sulfoxide, nitromethane, tetrahydrofuran and other polar solvents can be used. The preferable concentration of the activator complex in the solution is $10^{-5}$ to 1 M, and more desirably $10^{-3}$ to $10^{-1}$ M. Usually, the adsorption of the activator complex can be completed by immersing the photoelectrode in the activator complex solution for from about 10 seconds to 24 hours at 0° to 100° C.

The adsorption of the compound represented by general formula (I) or (II) on the surface of the photoelectrode of the present invention can be effected by immersing the photoelectrode in a solution containing at least one of these activator compounds. The alkyl groups represented by $R_1$, $R_2$, $R_3$ and $R_4$ in general formula (I) are, for example, methyl, ethyl, propyl, isopropyl, butyl, pentyl, hexyl, heptyl, octyl, nonyl and decyl. Among these substituents, methyl, ethyl, propyl and isopropyl groups are especially preferred. $R_5$, $R_6$, $R_7$, $R_8$, $R_9$ and $R_{10}$ are each a hydrogen atom, an alkyl group such as methyl, ethyl, propyl, butyl, pentyl, hexyl, heptyl, octyl, nonyl or decyl, or an alkoxy group such as methoxy, ethoxy, propoxy or butoxy. The anion $X^-$ includes, among others the halide-fluoride, chloride, bromide, iodide, hydroxide, nitrate and sulfate anions. The same exemplification can apply to $R_1$, $R_2$, $R_3$, $R_5$, $R_6$, $R_7$, $R_8$, $R_9$ and $R_{10}$ in general formula (II). As the activator compounds represented by general formula (I) or (II), there can be mentioned such compounds as 3,7-diaminophenothiazin-5-ium chloride, 3,7-diaminophenothiazin-5-ium iodide, 3,7-diaminophenothiazin-5-ium nitrate, 3,7-diamino-6-methylphenothiazin-5-ium chloride, 3,7-diamino-4,8-dimethylphenothiazin-5-ium fluoride, 3,7-diamino-4-butylphenothiazin-5-ium chloride, 3,7-bis(dimethylamino)phenothiazin-5-ium chloride, 3,7-bis(dimethylamino)-6-methoxyphenothiazin-5-ium chloride, 3-imino-7-aminophenothiazine, 3-methylimino-7-dimethylaminophenothiazine, 3-imino-7-dimethylaminophenothiazine, 2-methyl-3-imino-7-aminophenothiazine, 2,6-dimethyl-3-imino-7-aminophenothiazine and 3-imino-7-amino-8-methoxyphenothiazine. Among these compounds, 3,7-diaminophenothiazin-5-ium chloride and 3,7-bis(dimethylamino)phenothiazin-5-ium chloride can conveniently be used because they are commercially available as synthetic dyes. It is also possible to use a mixture of two or more of these activator compounds. The highest possible energy conversion efficiency can be obtained when the surface concentration of these activator compounds on the photoelectrode is $4 \times 10^{-8}$ to $4 \times 10^{-4}$ mole/BET $m^2$, more preferably $2 \times 10^{-6}$ to $2 \times 10^{-5}$ mole/BET $m^2$. These activator compounds are used in the form of solutions in such solvents as water, acetone, methanol, ethanol and chloroform. Among them, water is most convenient. An adequate concentration of the activator compound in the solution is $10^{-5}$ to 1 M, more preferably $10^{-3}$ to $10^{-1}$ M. A concentration of the activator compound less than $10^{-5}$ M causes insufficient adsorption thereof on the photoelectrode, which results in an insufficient improvement in energy conversion efficiency. On the other hand, a concentration of the activator compound higher than 1 M does not present any special advantage, since the adsorption of the activator compound reaches a state of saturation usually at a concentration below 1 M. The immersion of the photoelectrode in the activator solution is continued until the adsorption of the activator compound reaches a surface concentration within the range mentioned above. The time required usually ranges from about 1 minute to 24 hours, depending on the conditions such as the concentration and temperature of the solution. The temperature of the solution is usually 0° to 100° C., more preferably 5° to 80° C. After the immersion, the photoelectrode is washed with a solvent such as water to remove the free activator compound, followed by drying at 10° to 150° C.

The activator complexes described in paragraph (B) and the activator compounds described in paragraph (C) hereinabove in the Summary of the Invention are collectively referred to hereinafter as activator(s). When the adsorption energy of an activator on the photoelectrode is small, the activator will be desorbed into the electrolyte solution of the PEC during photoelectric conversion, causing a decrease in energy conversion efficiency. In such a case, it is recommended to add an adequate quantity of the activator to the electrolyte solution to maintain a constant surface concentration of the activator on the photoelectrode.

As mentioned above, the energy conversion efficiency of the photoelectrode composed of a surface-chalcogenated molybdenum or tungsten can be increased either (A) by doping, (B) by adsorption of activator complexes, or (C) by adsorption of activator compounds. However, it should be emphasized that a combination of these treatments, especially (A)+(B) or (A)+(C), is remarkably effective in increasing the energy conversion efficiency.

Figure 2:
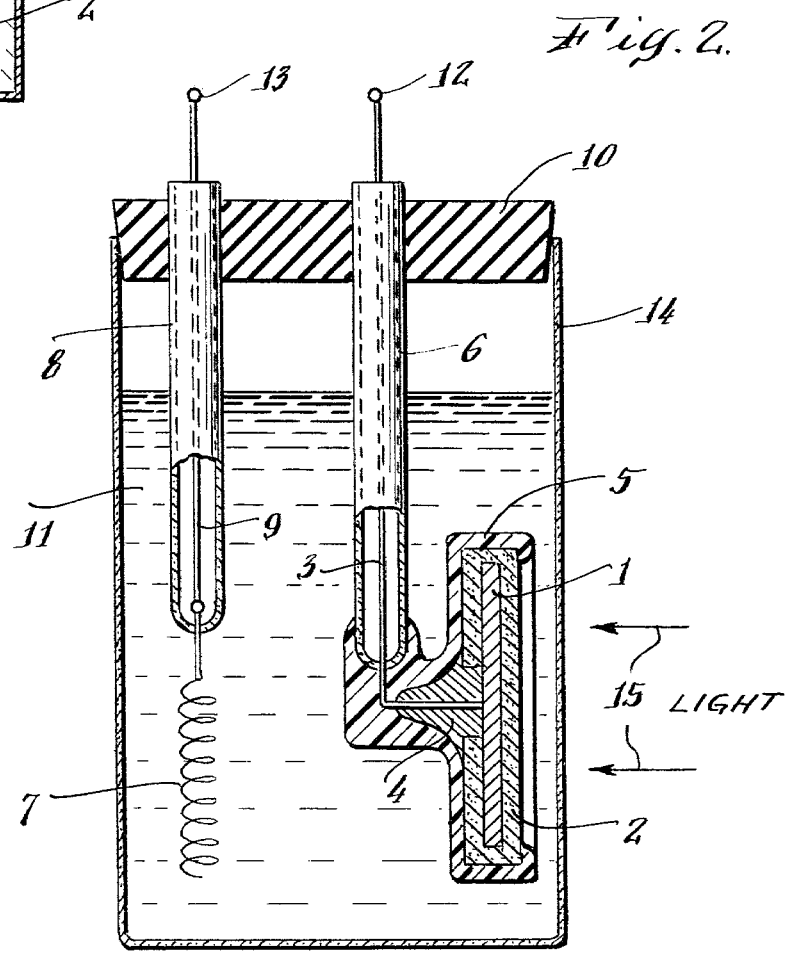
FIG. 2 illustrates a photoelectrode and a PEC used for measuring the photocurrent and photovoltage.

FIG. 2 illustrates one example of the photoelectrode and a PEC containing the same. The photoelectrode is composed of a molybdenum or tungsten base metal (1) having a surface-chalcogenated layer (2), a copper wire (3) is maintained in electrical contact with the base metal through use of silver paste (4) and a covering resin (5). The copper wire passes through glass tube (6) and terminates in terminal (12). The counter electrode is composed of a platinum wire (7) connected to a copper wire (9) which passes through glass tube (8) and terminates in terminal (13). The PEC is constructed by immersing the photoelectrode and counter electrode mentioned above in electrolyte solution (11) contained in a glass vessel (14). The glass tubes (6) and (8) leading from the cell are held in place by rubber stopper (10) which also seals the cell. Light is emitted from a radiation source (15), and the photovoltage and photocurrent between the terminals (12) and (13) are measured.

The present invention is further illustrated by the following non-limitative examples.

EXAMPLE 1

A molybdenum or tungsten plate (0.2 mm×10 mm×20 mm, 99.9% pure) was heated at 1100° C. for 1 hr. in a hydrogen sulfide stream to form a black sulfide layer on the surface of the metal plate. ESCA (electron spectroscopy for chemical analysis) and X-ray diffraction indicated that the sulfide layer consists of $MoS_2$ or $WS_2$. The thickness of the sulfide layer was about 15 microns for both of $MoS_2$ and $WS_2$. A part of the sulfide layer on one face of the plate was removed with sandpaper until the base metal was exposed, a copper wire was brought into contact with the exposed base metal using a silver paste. All the remaining surface portions of the plate except for another face of the plate was covered by an epoxy resin to complete construction of a photoelectrode as shown in FIG. 2. Then, after immersing this photoelectrode and a counter electrode (Pt) in an electrolyte solution containing 0.1 M $Fe^{2+}$, 0.9 M $Fe^{3+}$ and 0.1 M HCl, a PEC as shown in FIG. 2 was constructed. A 500 W tungsten-halogen lamp was used as radiation source.

The short circuit photocurrent (Isc) and open circuit photovoltage (Voc) of the PEC thus constructed were 0.51 mA/$Cm^2$ and 0.072 V, respectively, for the $MoS_2$ system and 0.48 mA/$cm^2$ and 0.068 V, respectively, for the $WS_2$ system.

EXAMPLE 2

Following the procedure of Example 1, metallic molybdenum and tungsten plates were respectively selenized by using hydrogen selenide instead of hydrogen sulfide with other reaction conditions being the same as in Example 1; selenide layers with a thickness of about 15 microns were formed on the surfaces of these plates. Photoelectrodes and PEC were constructed from these surface-selenized metal plates in the same manner as in Example 1, and the photocurrent and photovoltage were measured under the same conditions as in Example 1. The results were Isc=0.44 mA/$cm^2$ and Voc=0.068 V for the $MoSe_2$ system and Isc=0.39 mA/$cm^2$ and Voc=0.050 V for the $WSe_2$ system.

EXAMPLE 3

Following the procedure of Example 1, metallic molybdenum and tungsten plates were respectively tellurized by using 2% tellurium in nitrogen instead of hydrogen sulfide with other reaction conditions being the same as in Example 1, to form the telluride layers with a thickness of about 17 microns on these plates. The photoelectrodes made from these plates gave Isc=0.35 mA/$cm^2$ and Voc=0.051 V for the $MoTe_2$ system and Isc=0.30 mA/$cm^2$ and Voc=0.048 V for the $WTe_2$ system in the same PEC as in Example 1.

EXAMPLE 4

Simultaneous doping and chalcogenation were effected by using the apparatus shown in FIG. 1. 100 mg. of stannic oxide and a metallic molybdenum or tungsten plate were placed at 6 and 5 in FIG. 1, respectively. While keeping the temperatures of the first and second furnaces at 1100° C. and 950° C., respectively, hydrogen sulfide was passed through the reaction tube at 10 ml/min for 1 hr. The contents of tin in the 15-micron thick layers of $MoS_2$ and $WS_2$ thus obtained was $3.5\times10^{-4}$ and $2.1\times10^{-4}$ in terms of atomic ratio to Mo and W atoms, respectively. The photoelectrodes made from these plates gave Isc=2.2 mA/$cm^2$ and Voc=0.24 for the $MoS_2$ system, and Isc=2.0 mA/$cm^2$ and Voc=0.22 V for the $WS_2$ system.

EXAMPLES 5-7

Using 100 mg of $TiO_2$ (example 5), 100 mg of $In_2O_3$ (Example 6), or a physical mixture of 50 mg of $SnO_2$ and 50 mg of $In_2O_3$ (Example 7) in place of 100 mg of $SnO_2$ in Example 4, metallic molybdenum or tungsten plates were sulfurized under the same conditions as in Example 4. The photoelectrodes made from the surface-sulfurized plates thus obtained gave the photocurrent and photovoltage data shown in Table 1, under the same conditions as in Example 1.

EXAMPLES 8 AND 9

Tin doped selenide (Example 8) and telluride (Example 9) surface layers were formed on molybdenum or tungsten plates using hydrogen selenide and 2% tellurium in nitrogen, respectively, in place of hydrogen sulfide in Example 4, with other reaction conditions being the same as in Example 4. The photoelectrodes prepared from these surface-selenized or -tellurized metal plates gave the results shown in Table 1, under the same measuring conditions as in Example 1.

The contents of dopant atoms in the chalcogenide layers on the molybdenum or tungsten plates in Examples 5-9 were in the range of $5 \times 10^{-6}$ to $4 \times 10^{-4}$ in terms of atomic ratio to molybdenum or tungsten atoms.

EXAMPLES 10-12

Molybdenum or tungsten plates were sulfurized with hydrogen sulfide under the same conditions as in Example 1. Then the photoelectrodes constructed from these plates were immersed in an aqueous 0.01 M ammonium molybdate (Example 10), 0.01 M sodium tungstate (Example 11), or 0.01 M ruthenium trichloride (Example 12) solution for 1 hr at room temperature. Then, the photoelectrodes were washed with water to remove the free activator complexes, followed by drying at room temperature. These photoelectrodes gave the photocurrent and photovoltage data shown in Table 1, under the same conditions as in Example 1.

EXAMPLE 13

Surface-sulfurized molybdenum or tungsten plates doped with tin plus indium were prepared in the same way as in Example 7. The photoelectrodes constructed from these plates were immersed in an aqueous 0.01 M. ammonium molybdate solution for 1 hr at room temperature, followed by washing with water and drying at room temperature. The photoelectrodes thus activated gave the results shown in Table 1, under the same PEC conditions as in Example 1.

EXAMPLES 14 AND 15

Photoelectrodes were prepared in the same way as in Example 1 from surface-sulfurized molybdenum or tungsten plates. These photoelectrodes were immersed in an aqueous 0.01 M 3,7-diaminophenothiazin-5-ium chloride (Example 14) or 0.01 M 3,7-bis(dimethylamino)phenothiazin-5-ium chloride (Example 15) solution for 1 hr at room temperature, followed by washing with water and drying at room temperature. The amounts of the phenothiazines adsorbed on these photoelectrodes were in the range of $5 \times 10^6$ mole/BET $m^2$ to $9 \times 10^{-6}$ mole/BET $m^2$.

Under the same conditions as in Example 1, these photoelectrodes gave the results shown in Table 1.

EXAMPLE 16

Under the same conditions as in Example 7, surface-sulfurized molybdenum or tungsten plates doped with tin plus indium were prepared. The photoelectrodes constructed from these plates were immersed in an aqueous 0.01 M 3,7-diaminophenothiazin-5-ium chloride solution for 1 hr at room temperature, followed by washing with water and drying at room temperature. The photoelecrodes thus activated gave the results shown in Table 1, under the same PEC conditions as in Example 1.

EXAMPLE 17

Photoelectrodes were constructed from the surface-selenized molybdenum or tungsten plates prepared by the procedure of Example 2. These photoelectrodes were immersed in an aqueous 0.01 M 3,7-dimethylaminophenothiazin-5-ium chloride solution for 1 hr at room temperature, followed by washing with water and drying at room temperature. The photoelectorodes thus activated gave the results shown in Table 1, under the same conditions as in Example 1.

TABLE 1

| Example | Chalcogen | Dopant | Activator* | Mo system Isc (mA/cm$^2$) | Mo system Voc (V) | W system Isc (mA/cm$^2$) | W system Voc (V) |
|---|---|---|---|---|---|---|---|
| 1 | S | | | 0.51 | 0.072 | 0.48 | 0.068 |
| 2 | Se | | | 0.44 | 0.068 | 0.39 | 0.050 |
| 3 | Te | | | 0.35 | 0.051 | 0.30 | 0.048 |
| 4 | S | Sn | | 2.2 | 0.24 | 2.0 | 0.22 |
| 5 | S | Ti | | 2.1 | 0.22 | 1.9 | 0.21 |
| 6 | S | In | | 1.5 | 0.18 | 1.6 | 0.20 |
| 7 | S | Sn + In | | 4.5 | 0.35 | 3.8 | 0.32 |
| 8 | Se | Sn | | 2.0 | 0.22 | 1.9 | 0.21 |
| 9 | Te | Sn | | 1.2 | 0.12 | 1.1 | 0.11 |
| 10 | S | | A | 1.0 | 0.091 | 0.92 | 0.088 |
| 11 | S | | B | 1.0 | 0.092 | 0.91 | 0.086 |
| 12 | S | | C | 0.75 | 0.088 | 0.69 | 0.076 |
| 13 | S | Sn + In | A | 6.7 | 0.38 | 6.2 | 0.32 |
| 14 | S | | D | 2.0 | 0.12 | 1.8 | 0.10 |
| 15 | S | | E | 2.1 | 0.12 | 1.8 | 0.11 |
| 16 | S | Sn + In | D | 9.0 | 0.37 | 7.2 | 0.31 |
| 17 | Se | | D | 1.8 | 0.11 | 1.5 | 0.10 |

A = ammonium molybdate
B = sodium tungstate
C = ruthenium chloride
D = 3,7-diaminophenothiazin-5-ium chloride
E = 3,7-bis(dimethylamino)phenothiazin-5-ium chloride

What is claimed is:

1. A photoelectrode for a photoelectro-chemical cell, which is essentially composed of a surface-chalcogenated molybdenum or tungsten metal, wherein the chalcogenated layer is doped with at least one element selected from Group III$_b$, IV$_a$ or IV$_b$ of the Periodic Table.

2. The photoelectrode of claim 1, wherein the surface thereof contains at least one complex adsorbed thereon and selected from the group consisting of molybdenum complexes, tungsten complexes and ruthenium complexes.

3. The photoelectrode of claim 1, wherein the surface thereof contains at least one compound adsorbed thereon and represented by the general formula (I)

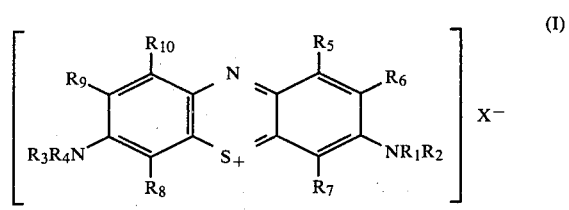

wherein, $R_1$, $R_2$, $R_3$ and $R_4$ are a hydrogen atom or an alkyl group containing 1 to 10 carbon atoms, $R_5$, $R_6$, $R_7$, $R_8$, $R_9$ and $R_{10}$ are a hydrogen atom, an alkyl group containing 1 to 10 carbon atoms or an alkoxy group containing 1 to 10 carbon atoms, and $X^-$ is an anion, or by the general formula (II)

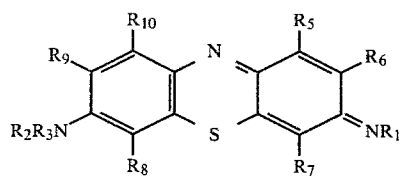 (II)
wherein, in formula (II), $R_1$, $R_2$, $R_3$, $R_5$, $R_6$, $R_7$, $R_8$, $R_9$ and $R_{10}$ are as defined with respect to formula (I).
* * * * *